(12) United States Patent
Yamada

(10) Patent No.: US 7,777,325 B2
(45) Date of Patent: Aug. 17, 2010

(54) POWER SEMICONDUCTOR MODULE

(75) Inventor: Junji Yamada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/046,046

(22) Filed: Mar. 11, 2008

(65) Prior Publication Data
US 2009/0085188 A1 Apr. 2, 2009

(30) Foreign Application Priority Data
Sep. 27, 2007 (JP) ............... 2007-251418

(51) Int. Cl.
H01L 23/48 (2006.01)
(52) U.S. Cl. ............ 257/690; 257/706; 257/707; 257/705; 257/717; 257/718; 257/E23.01
(58) Field of Classification Search ........... 257/690, 257/706, 707, 705, 717, 718, E23.01
See application file for complete search history.

(56) References Cited

U.S. PATENT DOCUMENTS

| 4,769,744 A | 9/1988 | Neugebauer et al. |
| 6,058,014 A | 5/2000 | Choudhury et al. |
| 6,260,920 B1 * | 7/2001 | Tolfsen ............... 297/256.16 |
| 2004/0137767 A1 * | 7/2004 | Suzuki et al. ............... 439/73 |
| 2005/0067654 A1 | 3/2005 | Schneider et al. |
| 2005/0280490 A1 | 12/2005 | Uchiyama et al. |

FOREIGN PATENT DOCUMENTS

| JP | 5-267537 | 10/1993 |
| JP | 11-330735 | 11/1999 |
| JP | 2001-144249 | 5/2001 |
| JP | 2001144249 A * | 5/2001 |
| JP | 2006-165499 | 6/2006 |

* cited by examiner

Primary Examiner—Lynne A Gurley
Assistant Examiner—Junghwa M Im
(74) Attorney, Agent, or Firm—Oblon, Spivak, McClelland, Maier & Neustadt, L.L.P.

(57) ABSTRACT

A power semiconductor module comprising: a power semiconductor element; a case for receiving the power semiconductor element; a control terminal which is connected to a control electrode of the power semiconductor element, the control terminal is installed in a state of protruding from an upper surface of the case; and a conductive spring which is inserted into the control terminal so that an inner surface of the spring makes contact with at least a part of the side surface of the control terminal, the conductive spring is electrically connected to a printed substrate placed as opposed to the upper surface of the case by making pressurization contact with the printed substrate.

9 Claims, 8 Drawing Sheets

POWER SEMICONDUCTOR MODULE

CROSS REFERENCE TO RELATED APPLICATION

The present application claims priority from Japanese Patent Application No. 2007-251418, which was filed on Sep. 27, 2007, the disclosure of which is herein incorporated by reference in its entirety.

TECHNICAL FIELD

The present invention is the invention according to a power semiconductor module, and particularly relates to a structure of a control terminal in a power semiconductor module equipped with an IGBT (Insulated Gate Bipolar Transistor) etc.

BACKGROUND

A power semiconductor module in which a free-wheel diode and plural switching elements such as an IGBT are combined and are installed in one package has been used in motor control or power control of industry, electric railways, automobiles, household electric appliances, etc. In such a power semiconductor module, generally, an external bus bar etc. were connected to a main circuit terminal through which a principal current flows by a method of screwing and a printed substrate in which an integrated circuit for control are mounted was connected to a control terminal by a method of soldering in a control circuit.

In such a conventional power semiconductor module, it is required that a user of the module gets a task of soldering for connection of a control terminal, and there were a problem of an increase in the number of man-hours, a problem of a decrease in reliability of soldering at the time of long-term use, etc. Therefore, a power semiconductor module with a structure in which a control terminal is formed in a spring structure and is pressurized and connected to a printed substrate by elastic force generated by compressing the spring and thereby the need for soldering work by a user is eliminated has been proposed (for example, see Patent References 1, 2).

[Patent Reference 1] JP-A-2001-144249 (Paragraph 0024 to Paragraph 0025, FIG. 3)

[Patent Reference 2] JP-A-2006-165499 (Paragraph 0010 to Paragraph 0013, FIG. 2)

SUMMARY

However, the power semiconductor module according to the conventional art has the following problems to be solved.

(1) In the conventional arts described in Patent References 1 and 2, the control terminal itself is formed in a spring structure, so that cost and the number of man-hours increase in its processing and attachment to the module.

(2) It is necessary to increase a contact pressure by increasing a spring length in order to improve reliability of the portion of contact between a control terminal and a printed substrate, but in the conventional art described in Patent Reference 1, the control terminal is insert-molded in a side wall of a resin case, so that its spring length is limited by a height of the case.

(3) In the conventional art described in Patent Reference 2, in order to hold a spring-shaped control terminal, a terminal reception part having an inside diameter of approximately the same dimension as that of an outside diameter of a first coil part in pressurization contact with a printed substrate in the control terminal is required. And cost and the number of man-hours increase in manufacture of the power semiconductor module.

(4) Further, in the conventional art described in Patent Reference 2, a distance between a printed substrate and the module is limited by a height of the terminal reception part as described above, so that flexibility in dimensional design of a user reduces.

(5) Also, in the conventional art described in Patent Reference 2, a spring-shaped control terminal is directly bonded to a wiring pattern on an insulating substrate inside the module by soldering etc., so that repulsion force by pressurizing and contacting a printed substrate is directly applied to the wiring pattern on the insulating substrate. As a result, at the time of long-term use, repulsion force by a spring is always applied to the inside of the module and thereby, a reliability problem of a fracture in solder of a bond part between the control terminal and the wiring pattern on the insulating substrate may be caused.

In order to solve the problems described above, a power semiconductor module has a power semiconductor element, a case for receiving the power semiconductor element, a control terminal which is connected to a control electrode of the power semiconductor element and is installed in a state of protruding from an upper surface of the case, and a conductive spring which is inserted into the control terminal so that an inner surface of the spring makes contact with at least a part of the side surface of the control terminal and is electrically connected to a printed substrate placed as opposed to the upper surface of the case by making pressurization contact with the printed substrate.

Since a power semiconductor module of the invention is connected to an external printed substrate by repulsion force through compression of a conductive spring, work of soldering is not required and the external printed substrate can be attached and detached smoothly and easily and also, a reliability problem of a fracture in solder at the time of long-term use can be solved.

Also, since the invention has a structure of inserting the conductive spring so that an inner surface of the spring makes contact with a control terminal, a structure of a control terminal of a conventional power semiconductor module can be used as it is and a big change in the module structure is not required and the invention can be implemented without increasing cost and the number of man-hours in a module manufacturing step.

Also, since a distance between the printed substrate and the power semiconductor module can be set arbitrarily, flexibility in dimensional design of a user improves.

Further, since the whole case upper surface is subjected to the repulsion force through compression of the conductive spring, physical stress is not intensively applied to a control electrode of a power semiconductor inside the module and an effect of improving long-term reliability can be obtained.

BRIEF DESCRIPTION OF THE DRAWINGS

Illustrative aspects of the invention will be described in detail with reference to the following figures wherein.

DETAILED DESCRIPTION OF THE PREFERRED EMBODIMENTS

First Embodiment

Figure 1:
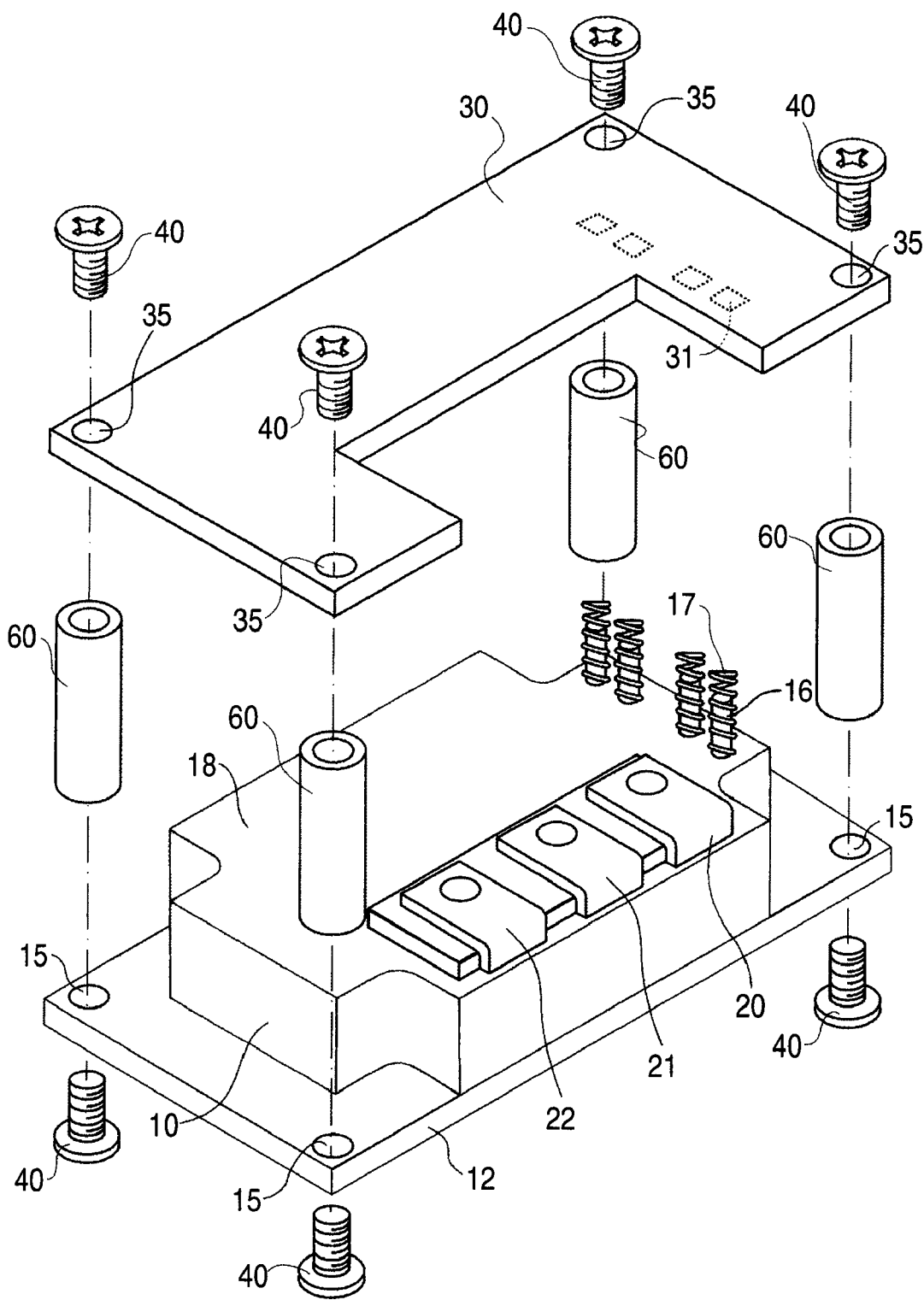
FIG. 1 is a perspective view of a power semiconductor module according to a first embodiment of the invention and a printed substrate for controlling the module.

FIG. 1 shows a perspective view of a power semiconductor module in a first embodiment for carrying out this invention and a printed substrate for controlling the module.

The power semiconductor module shown in FIG. 1 has a case 10 made of an insulating material such as a resin and a metal base plate 12 with high thermal conductivity. The four corners of the metal base plate 12 have throughholes 15. Main terminals 20 to 22 and control terminals 16 are protruded and arranged on an upper surface 18 of the case 10. The main terminals 20 to 22 are folded 90° to the side of the case 10 and are connected to an external bus bar (not shown) by a bolt etc. Metallic springs 17 as conductive springs are inserted into the control terminals 16. An inside diameter of the metallic spring 17 has approximately the same dimension as that of an outside diameter of the control terminal 16 and an inner surface of the metallic spring 17 makes contact with a side surface of the control terminal 16 and thereby, electrical connection between both of the spring 17 and the terminal 16 is made.

The metallic spring 17 is constructed of material such as phosphor bronze or steel material from the standpoint of elasticity and conductivity. And processing of Ni plating etc. is performed on the surface of the spring 17 in order to improve conductivity or corrosion resistance.

A printed substrate 30 is placed as opposed to a case upper surface 18, and the printed substrate 30 has electrodes 31 in the portions abutting on the control terminals 16 and the metallic springs 17 of the back surface. The printed substrate 30 has through holes 35 in the four corners in a manner similar to the metal base plate 12, and the printed substrate 30 is fixed to the metal base plate 12 through spacers 60 by bolts 40. Also, the printed substrate 30 has a U shape in which the portion located over the main terminals 20 to 22 is hollowed, and it is constructed so that a bus bar etc. can be attached and detached without trouble even in a state of fixing the printed substrate 30.

Figure 2:
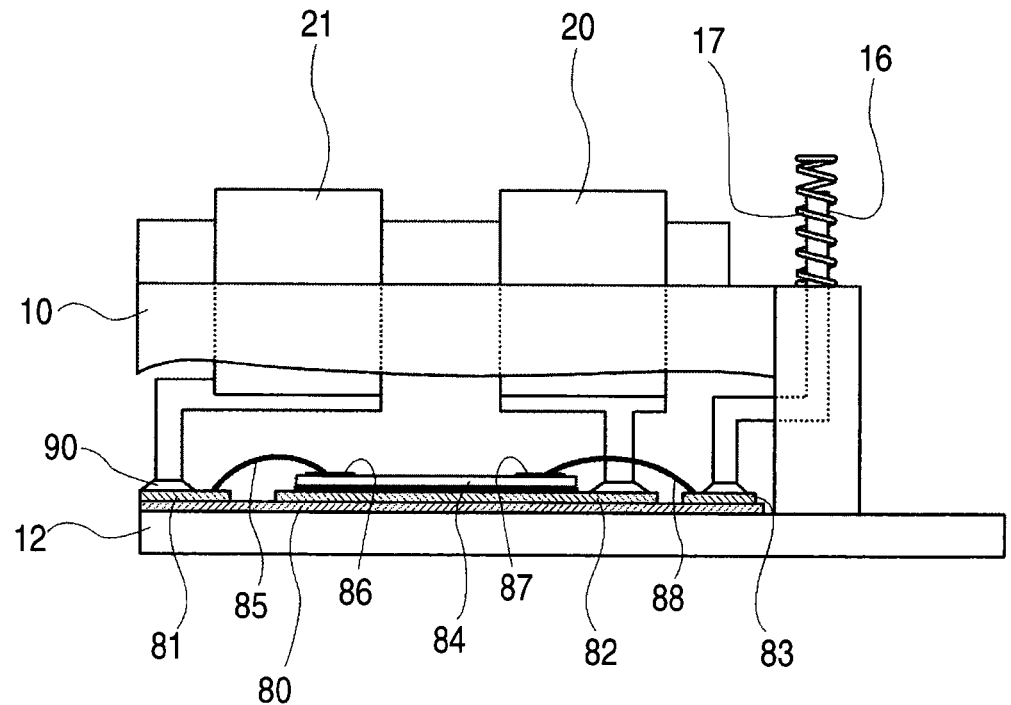
FIG. 2 is a side view of the power semiconductor module according to the first embodiment of the invention.

Details of a structure of the power semiconductor module and placement of the printed substrate will herein be described with reference to FIGS. 2 and 3. FIG. 2 is a side view of the power semiconductor module illustrating an internal structure by cutting out a part of the side surface of the case 10, and FIG. 3 is a side view for showing a state of placing and fixing the printed substrate 30.

In FIG. 2, an insulating substrate 80 is placed on the metal base plate 12. And wiring patterns 81, 82 and 83 are formed on the insulating substrate 80. An IGBT chip 84 is fixed on the wiring pattern 82 by a method of soldering etc. and also a collector electrode of the back surface is electrically connected to the wiring pattern 82. An emitter electrode 86 and a gate electrode 87 formed on a front surface of the IGBT chip 84 are electrically connected to the wiring patterns 81 and 83 through wire bonds 85 and 88, respectively.

Further, in the main electrode 20, the lower end is soldered to the wiring pattern 82 and also the upper end is protruded over the case 10 and then is folded 90°, in this way, an external collector terminal for principal current of the IGBT is formed. Also, in the main electrode 21, the lower end is soldered to the wiring pattern 81 and also the upper end is protruded over the case 10 and then is folded 90°, in this way, an external emitter terminal for principal current of the IGBT is formed. Also, in the control terminal 16, the lower end is soldered to the wiring pattern 83 and also the upper end is protruded over the case 10, in this way, an external gate terminal for an IGBT control signal is formed. The metallic spring 17 is inserted into the control terminal 16 protruded to the outside of the case 10. An inside diameter of the metallic spring 17 has approximately the same dimension as that of an outside diameter of the control terminal 16 and an inner surface of the metallic spring 17 makes contact with a side surface of the control terminal 16 and thereby, electrical connection between both of the spring 17 and the terminal 16 is made.

Figure 3:
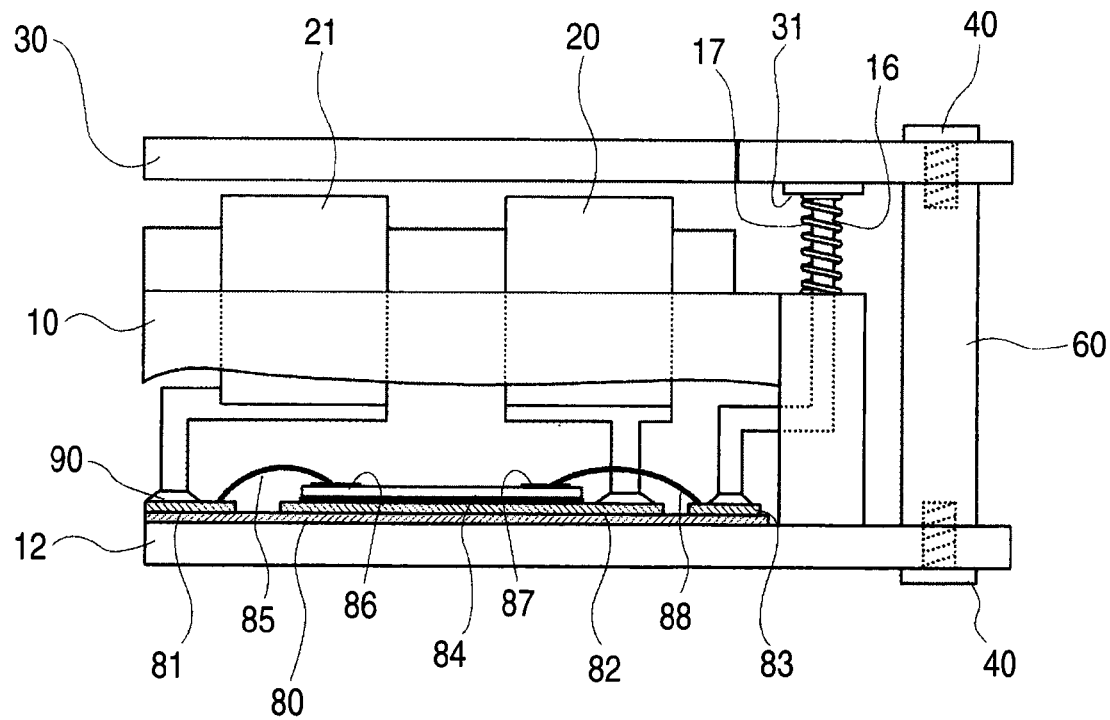
FIG. 3 is a side view of the power semiconductor module according to the first embodiment of the invention and the printed substrate for controlling the module.

In FIG. 3, the printed substrate 30 is placed over the case 10 and is fixed to the metal base plate 12 through the spacers 60 by the bolts 40. The electrodes 31 are disposed on a back surface of the printed substrate 30 abutting on the control terminals 16 and the metallic springs 17, and the metallic springs 17 are compressed by the printed substrate 30 and are pressed on the electrodes 31 by the elastic force. Consequently, a user of the power semiconductor module does not require a step of soldering etc. and obtains good electrical connection between the power semiconductor module and the printed substrate equipped with a control circuit etc.

A state of contact between the metallic springs 17 and the electrodes 31 can easily be set in the optimum state by properly selecting a length of the metallic spring 17 and adjusting the elastic force. Also, an upper surface of the case 10 is subjected to repulsion force of the metallic springs 17, so that mechanical stress is not applied to a solder bond part between the control terminals 16 and the wiring pattern 83 and long-term reliability is improved.

Figure 4A:
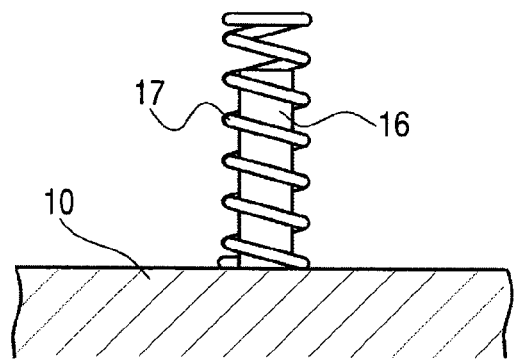
FIG. 4 is a side view of a control terminal and a metallic spring in the power semiconductor module according to the first embodiment of the invention.
Figure 4B:
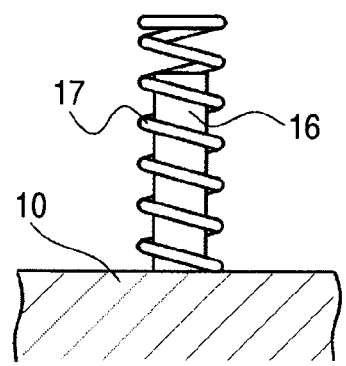
Figure 4C:
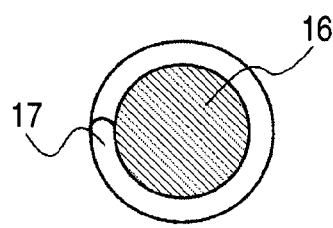

FIGS. 4A to 4C show detail views of the control terminal 16 and the metallic spring 17 in the embodiment. FIG. 4A is a front view of the control terminal 16, and FIG. 4B is a side view of the control terminal 16, and FIG. 4C is a top view of the control terminal 16. A sectional shape of the control terminal 16 protruding from the case 10 is a circular shape and an inside diameter of the metallic spring 17 is approximately the same as a sectional diameter of the control terminal 16. Since an inner surface of the metallic spring 17 makes contact with the whole circumference of a side surface of the control terminal 16, a contact area is wide and good electrical connection between the spring 17 and the terminal 16 can be obtained.

Figure 5A:
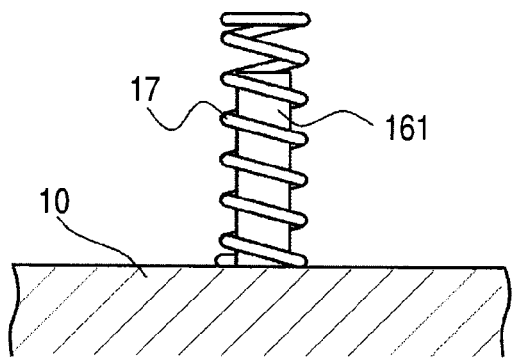
FIG. 5 is a side view of a control terminal and a metallic spring in the power semiconductor module according to a modified example of the first embodiment of the invention.
Figure 5B:
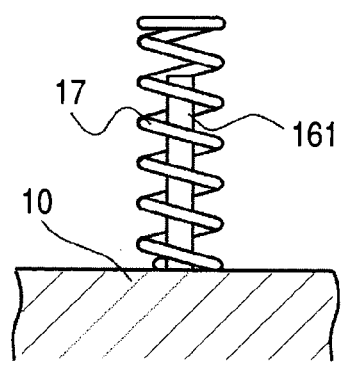
Figure 5C:
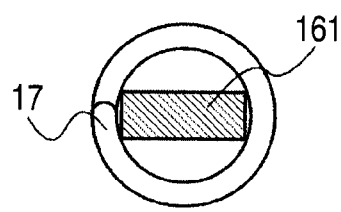

Also, as shown in FIGS. 5A to 5C, a sectional shape of a control terminal 161 of the portion protruding from the case 10 may form a quadrilateral shape. In this case, as shown in FIG. 5C, an inside diameter of a metallic spring 17 could be approximately the same as a diagonal length of the quadrilateral shape which is the sectional shape of this control terminal 161 and be constructed so that the metallic spring 17 makes contact with the control terminal 161 at four points. By such a configuration, in the case of molding the control terminal 161, the control terminal 161 can be implemented relatively simply by, for example, a method for punching and pressing a metal plate.

Second Embodiment

Figure 6:
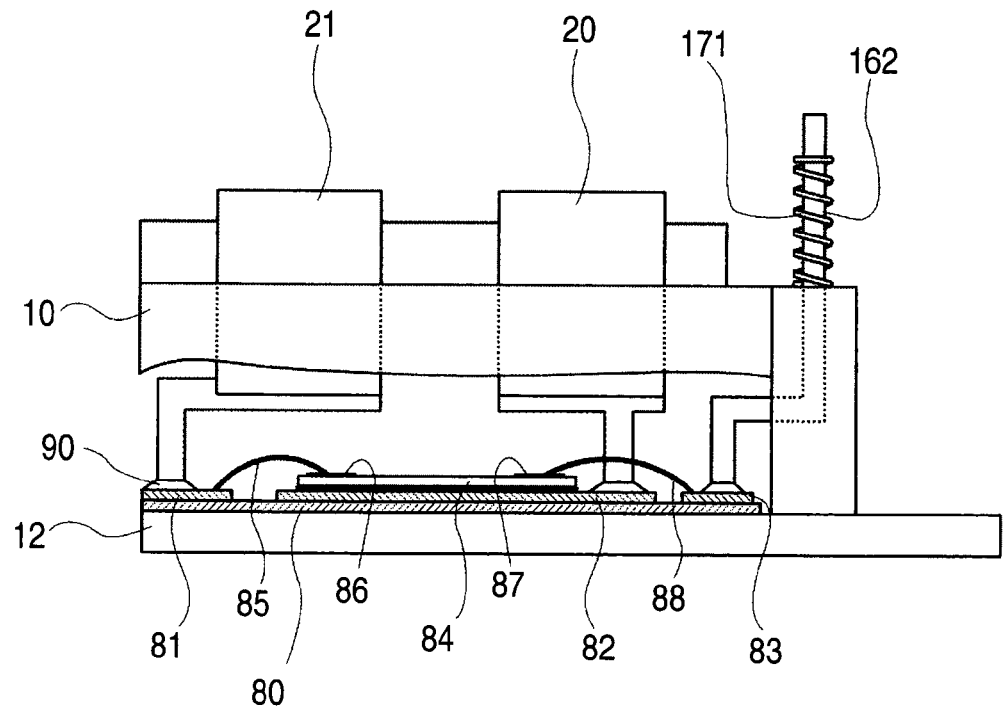
FIG. 6 is a side view of a power semiconductor module according to a second embodiment of the invention.
Figure 7:
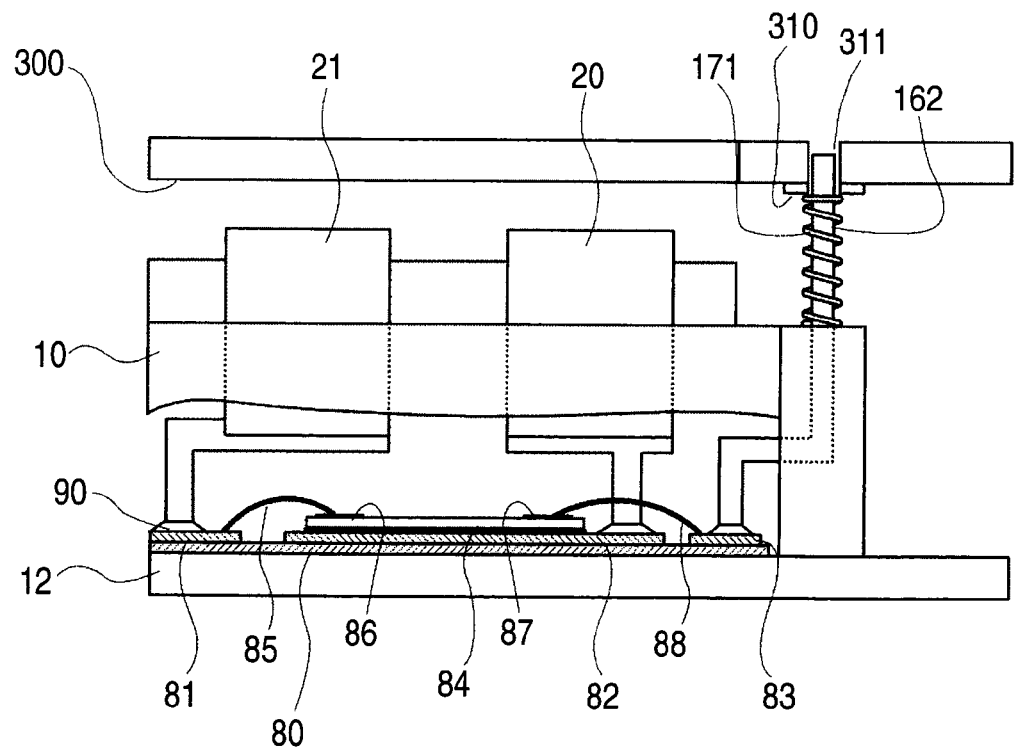
FIG. 7 is a side view of the power semiconductor module according to the second embodiment of the invention and a printed substrate for controlling the module.

FIGS. 6 and 7 show a side view of a power semiconductor module in a second embodiment of the invention and a side view at the time of placing a printed substrate for controlling the module. In addition, in each of the views, the same numerals are assigned to the same configurations as those of the first embodiment and overlapping description is omitted.

In the first embodiment, a free length of the metallic spring 17 was longer than a height a portion of the control terminal 16 protruding from an upper surface of the case 10. In such a configuration, there were cases where when the printed substrate 30 is attached, a state of contact between the metallic springs 17 and the electrodes 31 of the back surface of the printed substrate 30 cannot be visually checked. And a placement distance between the printed substrate 30 and the power semiconductor module is limited by a protrusion height of the control terminal 16.

The second embodiment is characterized in that a free length of a metallic spring 171 is made shorter than a protrusion height of a control terminal 162 as shown in FIG. 6. The details will hereinafter be described with reference to FIGS. 7 and 8.

In FIG. 7, a through hole 311 is disposed in an electrode 310 of a position corresponding to the control terminal 162 of a printed substrate 300. When the printed substrate 300 is placed, the top end of the control terminal 162 is inserted into the through hole 311. In addition, a diameter of the through hole 311 is larger than an inside diameter of the control terminal 162 or is approximately the same as the inside diameter. And the diameter of control terminal 162 is smaller than an outside diameter of the metallic spring 171.

Figure 8:
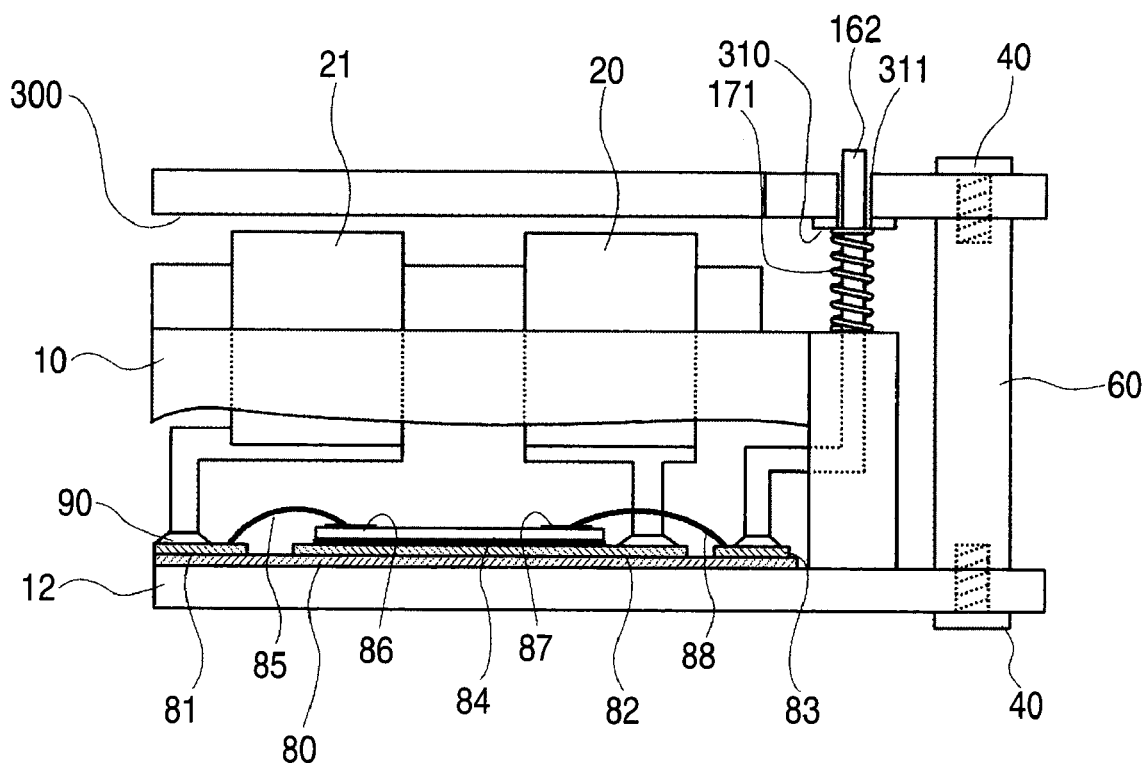
FIG. 8 is a side view showing a state of connection between the power semiconductor module according to the second embodiment of the invention and the printed substrate for controlling the module.

In FIG. 8, the control terminal 162 is inserted into the through hole 311 and at this time, the control terminal 162 is longer than the metallic spring 171, so that it becomes easy to insert the control terminal 162 into the through hole 311. Thereafter, the metallic spring 171 is compressed by the printed substrate 300 and the control terminal 162 extending through the through hole 311 can be visually checked from a front surface of the printed substrate 300, so that it can be checked that the metallic spring 171 correctly abuts on the electrode 310 of the back surface. Also, the control terminal 162 is placed in a state of extending through the printed substrate 300, so that a placement distance between the printed substrate 300 and the power semiconductor module is not limited by a protrusion height of the control terminal 162. And a height of a spacer 60 can properly be selected to freely set a distance between the printed substrate and the module, and an advantage of improving flexibility in dimensional design of a user is obtained.

Third Embodiment

Figure 9A:
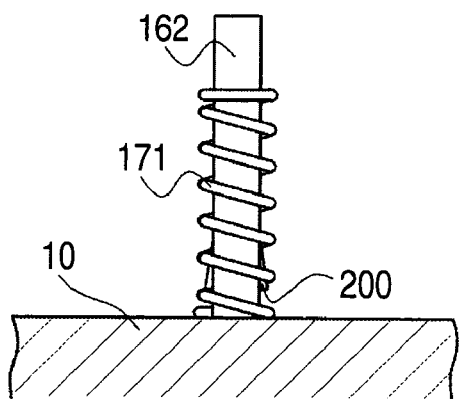
FIG. 9 is a side view of a control terminal and a metallic spring of a power semiconductor module according to a third embodiment of the invention.
Figure 9B:
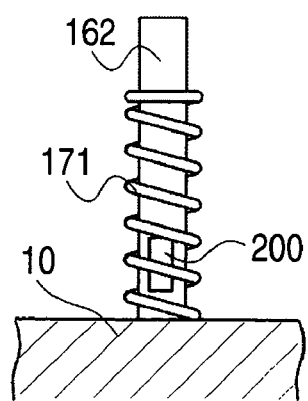
Figure 10A:
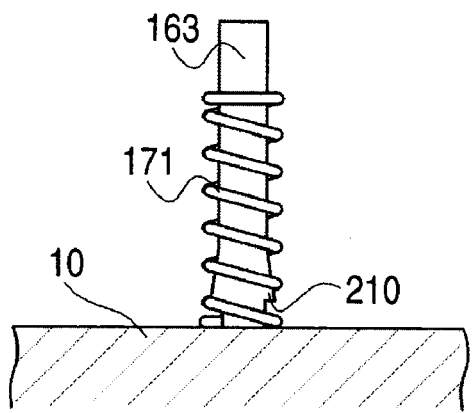
FIG. 10 is a side view of a control terminal and a metallic spring of the power semiconductor module according to a modified example of the third embodiment of the invention.
Figure 10B:
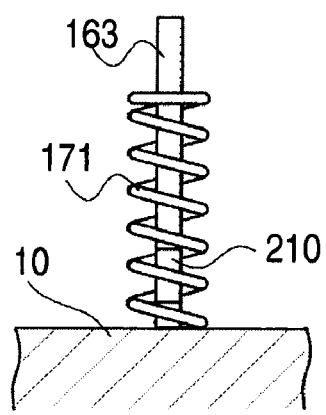

FIGS. 9 and 10 show side views of metallic springs and control terminals of a power semiconductor module in a third embodiment of the invention. The present embodiment is characterized in that a tapered protrusion is disposed in a root part of a control terminal as a fixation mechanism of a metallic spring 171.

In the first and second embodiments, the metallic spring 17 was only inserted into the control terminal 16 having a single thickness and its fixation was performed by only friction between both of the metallic spring 17 and the control terminal 16. Therefore, there were cases where the metallic spring 17 is easily detached from the control terminal 16 when the metallic spring 17 is pulled upward.

In FIG. 9, a tapered protrusion 200 in which the upper portion is thinner and the lower portion becomes gradually thicker is disposed in a root part of a control terminal 162 whose sectional shape is a circle. When the metallic spring 171 is inserted into the control terminal 162, the metallic spring 171 is pushed radially by the protrusion 200, so that the metallic spring 171 can be inserted easily. Even when the metallic spring 171 is pulled upward after the insertion, a part of the spring is hooked to the thick portion of the lower portion of the protrusion 200, so that the metallic spring 171 is not detached easily.

A position in which the protrusion 200 is disposed in the control terminal 162 may be any places as long as the position is places to which the spring is hooked when the metallic spring 171 is inserted, but it is desirable to be disposed in the root part where the protrusion 200 does not interfere with a through hole 311 in the case of placing a printed substrate 300 having the through hole 311 as shown in the second embodiment.

FIG. 10 is an example in which a tapered protrusion 210 is disposed in a side surface of a control terminal 163 when a sectional shape of the control terminal 163 is a quadrilateral shape, and the control terminal 163 and the protrusion 210 can simultaneously be integrally molded relatively simply by, for example, a method for punching and pressing a metal plate.

Fourth Embodiment

In the second embodiment, a diameter of the through hole 311 disposed in the printed substrate 300 is larger than an inside diameter of the control terminal 162 or is approximately the same as the inside diameter. And the diameter of the through hole 311 is smaller than an outside diameter of the metallic spring 171. But its dimensional margin is only a thickness of spring material of the metallic spring 171 and high accuracy of processing is required. When the diameter of the through hole 311 is larger than the outside diameter of the metallic spring 171, there are cases where the metallic spring 171 itself as well as the control terminal 162 enter the through hole 311 and the metallic spring 171 does not make contact with the electrode 310 of the back surface of the printed substrate 300.

Figure 11:
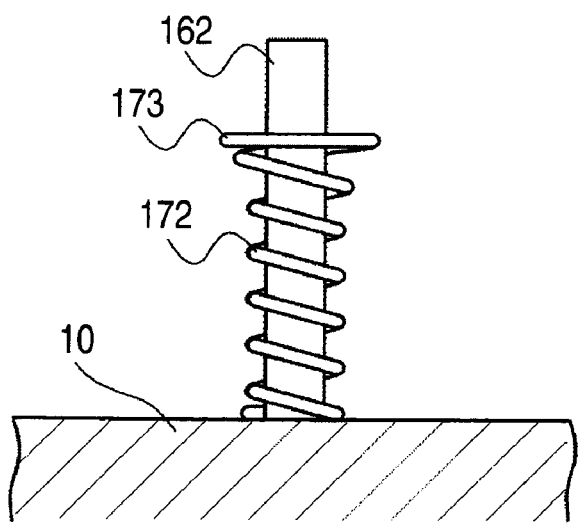
FIG. 11 is a side view of a control terminal and a metallic spring of a power semiconductor module according to a fourth embodiment of the invention.
Figure 12:
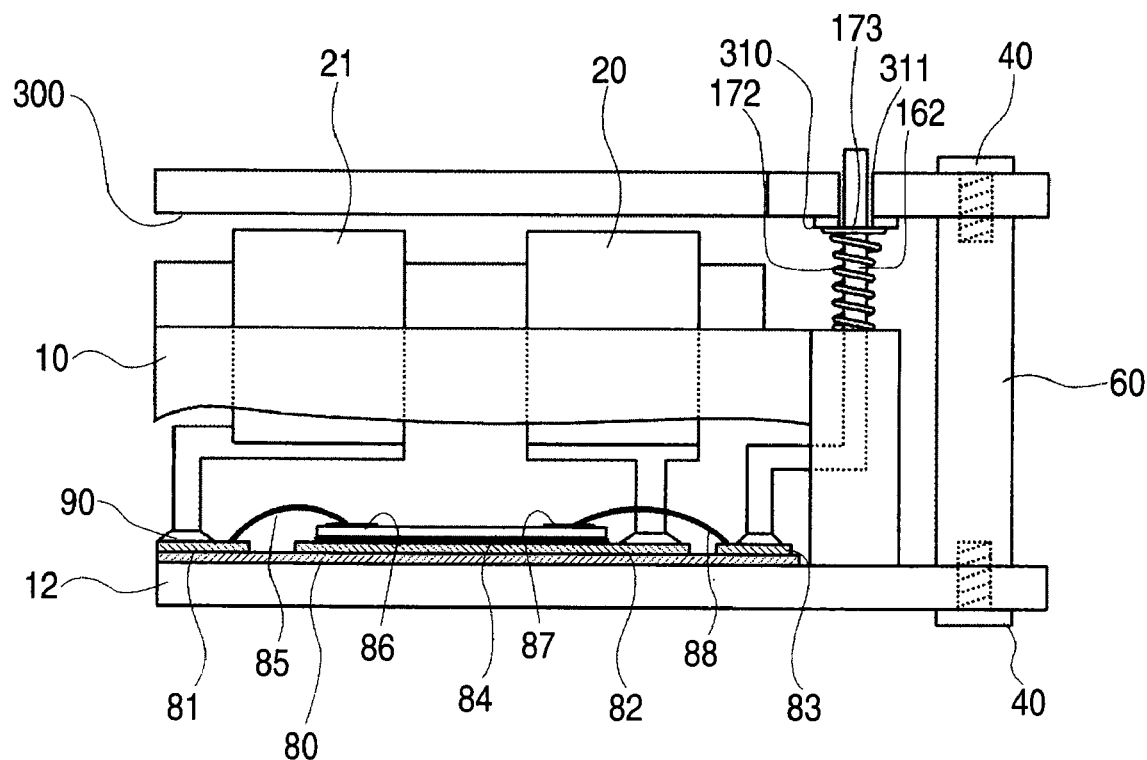
FIG. 12 is a side view showing a state of connection between the power semiconductor module according to the fourth embodiment of the invention and a printed substrate for controlling the module.

FIG. 11 shows a side view of a metallic spring and a control terminal of a power semiconductor module in a fourth embodiment of the invention and also, FIG. 12 shows a side view at the time of fixing a printed substrate 300 to the power semiconductor module in the present embodiment. The embodiment has an inverse tapered metallic spring 172 in which an upper part of the metallic spring 172, that is, the upper end 173 making contact with the printed substrate 300 is widened, and the inside diameter is larger than a diameter of a control terminal 162 or a through hole 311 disposed in the printed substrate 300 placed.

By such a structure, even when a dimension of the through hole 311 is slightly large, the metallic spring 172 does not enter the through hole 311 and an effect of surely maintaining contact with an electrode 310 is obtained as shown in FIG. 12.

Fifth Embodiment

Figure 13:
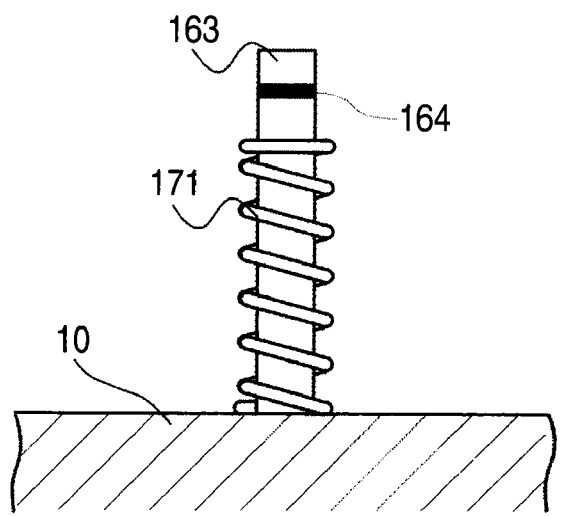
FIG. 13 is a side view of a control terminal and a metallic spring of a power semiconductor module according to a fifth embodiment of the invention.
Figure 14:
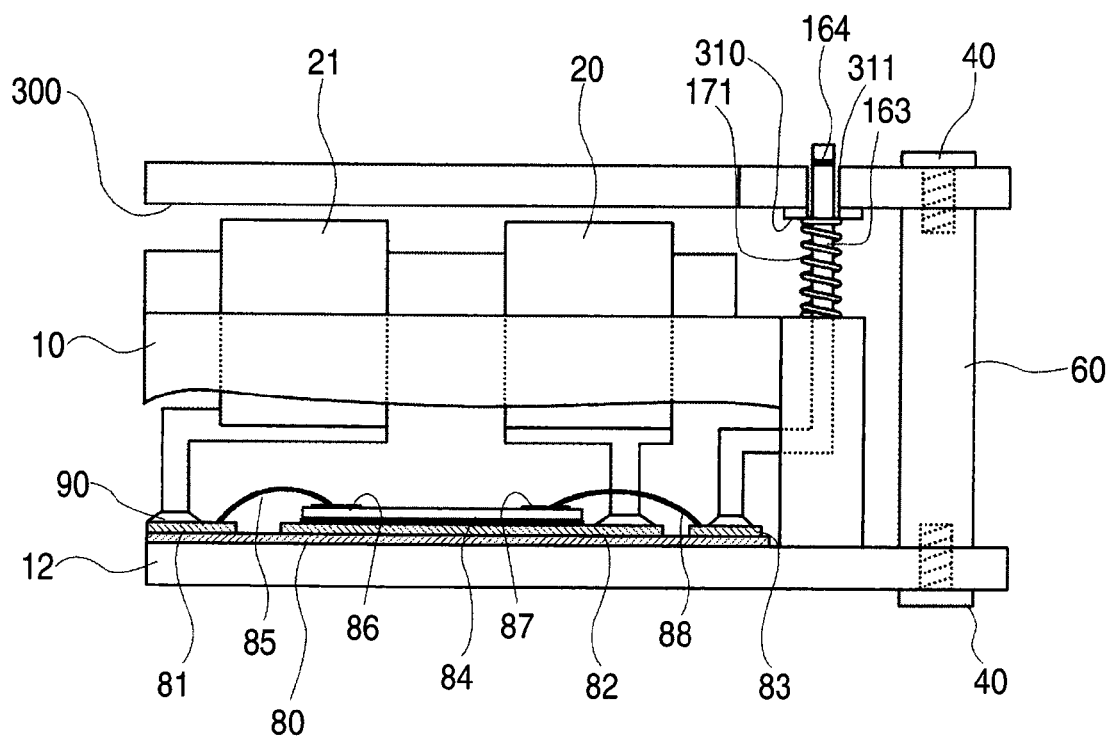
FIG. 14 is a side view showing a state of connection between the power semiconductor module according to the fifth embodiment of the invention and a printed substrate for controlling the module.

FIG. 13 shows a side view of a metallic spring and a control terminal of a power semiconductor module in a fifth embodiment of the invention and also, FIG. 14 shows a side view at the time of fixing a printed substrate 300 to the power semiconductor module in the present embodiment. As shown in FIG. 13, a compression amount check unit 164 such as a colored mark or an engraved mark may be disposed at a predetermined height of a control terminal 163. By such a configuration, it can be checked that it is a predefined amount of compression when a metallic spring 171 is compressed and the control terminal 163 appears on a front surface and the metallic spring 171 is further compressed to a place capable of visually checking the compression amount check unit 164 at the time of placing the printed substrate 300 as shown in FIG. 14.

The concrete embodiments of the invention have been described above, but the invention is not limited to the embodiments and various modifications can be made. For example, the example of using the IGBT as a power semiconductor element has been shown in the invention, but power semiconductor elements (for example, a MOSFET or a power transistor) having other control electrodes may be used, so that the power semiconductor elements are included in the invention. Also, the example of using the metallic spring as the conductive spring has been shown in the invention, but it is not limited to the metal and, for example, a plastic spring in which metal plating is performed on the surface can be used as long as the plastic spring has conductivity and elasticity as a spring, so that the plastic spring is included in the invention. Also, the example of using the IGBT module as the power semiconductor module has been described in the invention, but those skilled in the art can easily think up an idea of being applied to means having a control terminal such as an IPM (Intelligent Power Module) including an IC for control.

What is claimed is:

1. A power semiconductor module comprising:
a power semiconductor element;
a case for receiving the power semiconductor element;
a control terminal which is connected to a control electrode of the power semiconductor element, the control terminal has a portion that is protruding from an upper surface of the case; and
a conductive spring arranged around the control terminal so that an inner surface of the spring makes contact with at least a part of the side surface of the control terminal, the conductive spring is electrically connected to a printed substrate in a compressed state, the printed substrate placed opposed to the upper surface of the case by making pressurization contact with the compressed conductive spring, and in an uncompressed state, (i) a length of the conductive spring is greater than a length of the protruding portion of the control terminal, and (ii) an upper portion of the conductive spring is not arranged around the control terminal in the uncompressed state.

2. The power semiconductor module according to claim 1, wherein the control terminal is inserted into a hole disposed in the printed substrate.

3. The power semiconductor module according to claim 2, wherein the conductive spring is fixed to the control terminal or the upper surface of the case.

4. The power semiconductor module according to claim 3, wherein the control terminal comprises a tapered protrusion disposed in a root part of the protruding portion of the control terminal as a fixation mechanism of the conductive spring.

5. The power semiconductor module according to claim 1, wherein only the upper end of the conductive spring making contact with the printed substrate has an inside diameter larger than an outside diameter of the control terminal.

6. The power semiconductor module according to claim 1, further comprising; a compression amount check unit which checks a compression amount of the conductive spring, the compression amount check unit is disposed in the control terminal.

7. The power semiconductor module according to claim 6, wherein the compression amount check unit is a colored mark which is disposed at a predetermined height of the control terminal.

8. The power semiconductor module according to claim 6, wherein the compression amount check unit is an engraved mark which is disposed at a predetermined height of the control terminal.

9. The power semiconductor module according to claim 1, wherein one end of the conductive spring is in direct contact with the upper surface of the case and the other end of the conductive spring is in direct contact with an electrode that is located on a lower surface of the printed substrate.

* * * * *